(12) United States Patent
Scipioni

(10) Patent No.: US 8,455,840 B2
(45) Date of Patent: Jun. 4, 2013

(54) GAS FIELD ION MICROSCOPES HAVING MULTIPLE OPERATION MODES

(75) Inventor: Lawrence Scipioni, Bedford, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 20 days.

(21) Appl. No.: 13/276,879

(22) Filed: Oct. 19, 2011

(65) Prior Publication Data

US 2012/0068067 A1 Mar. 22, 2012

Related U.S. Application Data

(63) Continuation of application No. PCT/US2010/033339, filed on May 3, 2010.

(60) Provisional application No. 61/177,439, filed on May 12, 2009.

(51) Int. Cl.
*H01J 27/26* (2006.01)
*H01J 27/02* (2006.01)
*H01J 37/26* (2006.01)
*H01J 49/10* (2006.01)

(52) U.S. Cl.
USPC ............. 250/423 F; 250/423 R; 250/424; 250/492.2; 250/492.3; 250/493.1

(58) Field of Classification Search
USPC ............ 250/423 F, 423 R, 424, 492.2, 492.3, 250/493.1
See application file for complete search history.

(56) References Cited

U.S. PATENT DOCUMENTS

| | | | |
|---|---|---|---|
| 5,583,344 A | 12/1996 | Mizumura et al. | |
| 5,825,035 A | 10/1998 | Mizumura et al. | |
| 7,485,873 B2 * | 2/2009 | Ward et al. | 250/423 F |
| 8,110,814 B2 * | 2/2012 | Ward et al. | 250/423 F |
| 2007/0051900 A1 | 3/2007 | Ward et al. | |
| 2007/0138388 A1 | 6/2007 | Ward et al. | |
| 2007/0158558 A1 | 7/2007 | Ward et al. | |
| 2007/0215802 A1 | 9/2007 | Ward et al. | |
| 2007/0228287 A1 | 10/2007 | Ward et al. | |
| 2008/0111069 A1 | 5/2008 | Notte | |
| 2008/0217555 A1 | 9/2008 | Ward et al. | |
| 2009/0110951 A1 | 4/2009 | Kuo et al. | |
| 2009/0114840 A1 | 5/2009 | Ward et al. | |

FOREIGN PATENT DOCUMENTS

| | | |
|---|---|---|
| WO | WO 97/40493 | 10/1997 |
| WO | WO 2007/067296 | 6/2007 |
| WO | WO 2009/014811 | 1/2009 |

OTHER PUBLICATIONS

International Preliminary Report on Patentability for corresponding PCT Application No. PCT/US2010/033339, dated Nov. 24, 2011.
Kuo et al., "Noble Metal/W(111) Single-Atom Tips and Their Field Electron and Ion Emission Characteristics," Jap. J. of App. Phys., 45(11):8972-8983, 2006.
Scipioni et al., "Performance of multicusp plasma ion source for focused ion beam applications," J. Vac. Sci. & Technol., 18(6):3194-3197, 2000.
International Search Report, for the corresponding PCT Application No. PCT/US2010/033339, dated Dec. 30, 2010.

\* cited by examiner

*Primary Examiner* — Nikita Wells
(74) *Attorney, Agent, or Firm* — Fish & Richardson P.C.

(57) ABSTRACT

The disclosure relates to ion beams systems, such as gas field ion microscopes, having multiple modes of operation, as well as related methods. In some embodiments, the disclosure provides a method of operating a gas field ion microscope system that includes a gas field ion source, where the gas field ion source includes a tip including a plurality of atoms.

18 Claims, 4 Drawing Sheets

GAS FIELD ION MICROSCOPES HAVING MULTIPLE OPERATION MODES

CROSS-REFERENCE TO RELATED APPLICATIONS

This application is a continuation of, and claims priority under 35 U.S.C. §120 to, international application PCT/US2010/033339, filed May 3, 2010, which claims priority under 35 U.S.C. §119(e)(1) to U.S. Provisional Application No. 61/177,439, filed May 12, 2009. The contents of both of these applications are hereby incorporated by reference in entirety.

FIELD

The disclosure relates to ion beams systems, such as gas field ion microscopes, having multiple modes of operation, as well as related methods.

BACKGROUND

Semiconductor fabrication typically involves the preparation of an article (a semiconductor article) that includes multiple layers of materials sequentially deposited and processed to form an integrated electronic circuit, an integrated circuit element, and/or a different microelectronic device. Such articles typically contain various features (e.g., circuit lines formed of electrically conductive material, wells filled with electrically non-conductive material, regions formed of electrically semiconductive material) that are precisely positioned with respect to each other (e.g., generally on the scale of within a few nanometers). The location, size (length, width, depth), composition (chemical composition) and related properties (conductivity, crystalline orientation, magnetic properties) of a given feature can have an important impact on the performance of the article. For example, in certain instances, if one or more of these parameters is outside an appropriate range, the article may be rejected because it cannot function as desired. As a result, it is generally desirable to have very good control over each step during semiconductor fabrication, and it would be advantageous to have a tool that could monitor the fabrication of a semiconductor article at various steps in the fabrication process to investigate the location, size, composition and related properties of one or more features at various stages of the semiconductor fabrication process. As used herein, the term semiconductor article refers to an integrated electronic circuit, an integrated circuit element, a microelectronic device or an article formed during the process of fabricating an integrated electronic circuit, an integrated circuit element, a microelectronic device. A semiconductor article can be, for example, a portion of a flat panel display or a photovoltaic cell.

Regions of a semiconductor article can be formed of different types of material (electrically conductive, electrically non-conductive, electrically semiconductive). Exemplary electrically conductive materials include metals, such as aluminum, chromium, nickel, tantalum, titanium, tungsten, and alloys including one or more of these metals (e.g., aluminum-copper alloys). Metal silicides (e.g., nickel silicides, tantalum silicides) can also be electrically conductive. Exemplary electrically non-conductive materials include borides, carbides, nitrides, oxides, phosphides, and sulfides of one or more of the metals (e.g., tantalum borides, tantalum germaniums, tantalum nitrides, tantalum silicon nitrides, and titanium nitrides). Exemplary electrically semiconductive materials include silicon, germanium and gallium arsenide. Optionally, an electrically semiconductive material can be doped (p-doped, n-doped) to enhance the electrical conductivity of the material.

Typical steps in the deposition/processing of a given layer of material include imaging the article (e.g., to determine where a desired feature to be formed should be located), depositing an appropriate material (e.g., an electrically conductive material, an electrically semiconductive material, an electrically non-conductive material) and etching to remove unwanted material from certain locations in the article. Often, a photoresist, such as a polymer photoresist, is deposited/exposed to appropriate radiation/selectively etched to assist in controlling the location and size of a given feature. Typically, the photoresist is removed in one or more subsequent process steps, and, in general, the final semiconductor article desirably does not contain an appreciable amount of photoresist.

Ion microscope systems can be used to produce ions that are used, for example, to image a semiconductor sample, obtain chemical information about a semiconductor sample, and/or perform chemistry on a semiconductor sample. Microscope systems that use a gas field ion source to generate ions that can be used in sample analysis (e.g., imaging) are referred to as gas field ion microscopes. A gas field ion source is a device generally includes a tip (typically having an apex with 10 or fewer atoms) that can be used to ionize neutral gas species to generate ions (e.g., in the form of an ion beam) by bringing the neutral gas species into the vicinity of the electrically conductive tip (e.g., within a distance of about four to five angstroms) while applying a high positive potential (e.g., one kV or more relative to the extractor) to the apex of the electrically conductive tip.

SUMMARY

In general, the disclosure relates to gas field ion microscope systems and related methods. The microscope systems can provide enhanced flexibility for operation in different modes. In some embodiments, a microscope system can be switched between a first mode of operation involving a relatively low ion beam current and/or a relatively small spot size and a second mode of operation involving a relatively high ion beam current and/or a relatively large spot size without removing the sample from the microscope system (e.g., without moving the sample within the microscope system). This can, for example, result significant improvements in efficiency and cost in handling, preparing and/or analyzing various types of samples, such as semiconductor samples. The first mode of operation may be desirable, for example, when seeking to image a sample with relatively high precision, and/or when seeking to perform sample chemistry (e.g., etching and/or deposition) with relatively high precision. The second mode of operation may be desirable, for example, when obtaining information about a sample which would take a relatively long period of time with a lower ion beam current and/or smaller spot size. By using a relatively high ion beam current and/or a relatively large spot size, the potential loss in precision can be sufficiently compensated for with the increase in speed. As an example, in some cases, the type of particle detected (e.g., a scattered ion) to obtain information (e.g., chemical information) about the sample may be generated at relatively low abundance and/or be difficult to detect with relatively high efficiency. In such cases, increasing the ion beam current can reduce the time used to collect a sufficient number of particles to obtain the desired information. Alternatively or additionally, in certain instances, it may be desirable to perform chemistry on a sample (e.g., etch the sample and/or deposit material on the sample) in a relatively short period of time (e.g., in a relatively high throughput process). In such circumstances, increasing the ion beam current can reduce the time used to process a given sample or a given collection of samples. In some embodiments, a microscope system can be designed to operate in more than two different modes. In certain embodiments, a microscope system can be switched between various modes of operation multiple different times.

In one aspect, the disclosure generally provides a method of operating a gas field ion microscope system including a gas field ion source. The gas field ion source includes a tip including a plurality of atoms. The method includes operating the gas field ion microscope system in a first mode including interacting a first ion beam with a sample. At least about 80% of the ions in the first ion beam are generated by a first number of atoms of the plurality of atoms of the tip. The method also includes operating the gas field ion microscope system in a second mode in a second mode including interacting a second ion beam with the sample. At least about 80% of the ions in the second ion beam are generated by a second number of atoms of the plurality of atoms of the tip. The first mode is different from the second mode, and the first number of atoms is different from the second number of atoms.

In another aspect, the disclosure generally provides a method of operating a gas field ion microscope system including a gas field ion source. The method includes interacting a first ion beam generated by the ion source with a sample. The first ion beam having a current of at most one nanoamp at a surface of the sample. The method also includes interacting a second ion beam generated by the ion source with the sample. The second ion beam having a current of at least 10 picoAmps at the surface of the sample.

In a further aspect, the disclosure generally provides a method of operating a gas field ion microscope system including a gas field ion source. The method includes interacting a first ion beam generated by the ion source with a sample. The first ion beam having a first ion current at a surface of the sample. The method also includes interacting a second ion beam generated by the ion source with the sample. The second ion beam having a second current at the surface of the sample, and the second ion current is at least two times the first ion current.

In an additional aspect, the disclosure generally provides a method of operating a gas field ion microscope system including a gas field ion source. The method includes interacting a first ion beam generated by the ion source with a sample to obtain information about a sample, and interacting a second ion beam generated by the ion source with the sample to perform chemistry on the sample. The first ion beam has a first ion current at a surface of the sample, and the second ion beam has a second ion current at the surface of the sample that is different from the first ion current at the surface of the sample.

In another aspect, the disclosure generally provides a method of operating a gas field ion microscope system including a gas field ion source. The method includes interacting a first ion beam generated by the ion source to etch a sample at a first rate, and interacting a second ion beam generated by the ion source with the sample to etch the sample at a second rate greater than the first rate.

Other features and advantages of the disclosure will be apparent from the description, drawings, and claims.

DETAILED DESCRIPTION

General Discussion

Information relating to gas field ion microscope systems and related methods is generally disclosed, for example, in U.S. Patent Application Publication No. US 2007/0158558, U.S. Ser. No. 61/092,919 and U.S. Ser. No. 61/074,361, each of which is hereby incorporated by reference in its entirety.

Figure 1:
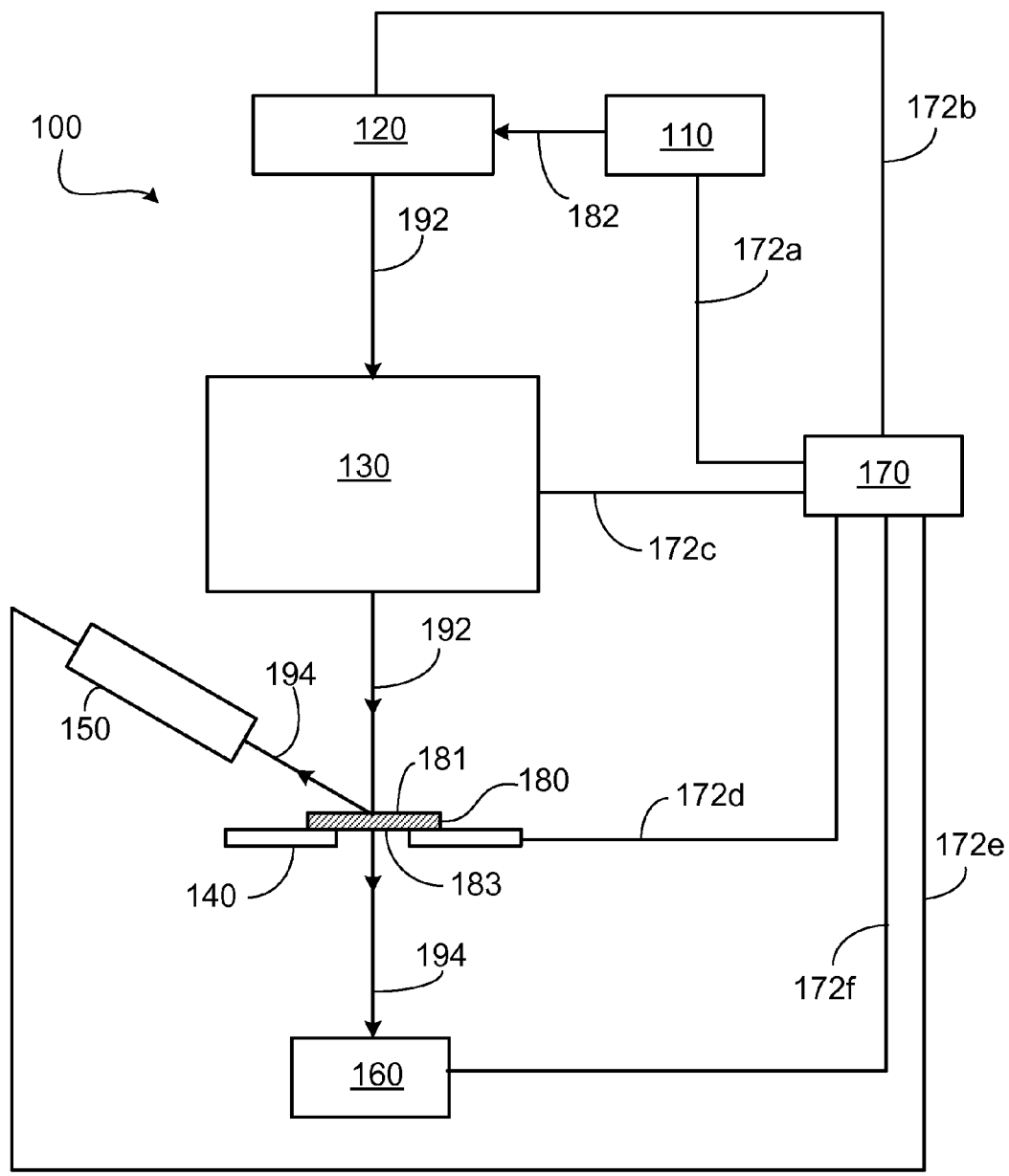
FIG. 1 is a schematic diagram of an ion microscope system.

FIG. 1 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 2:
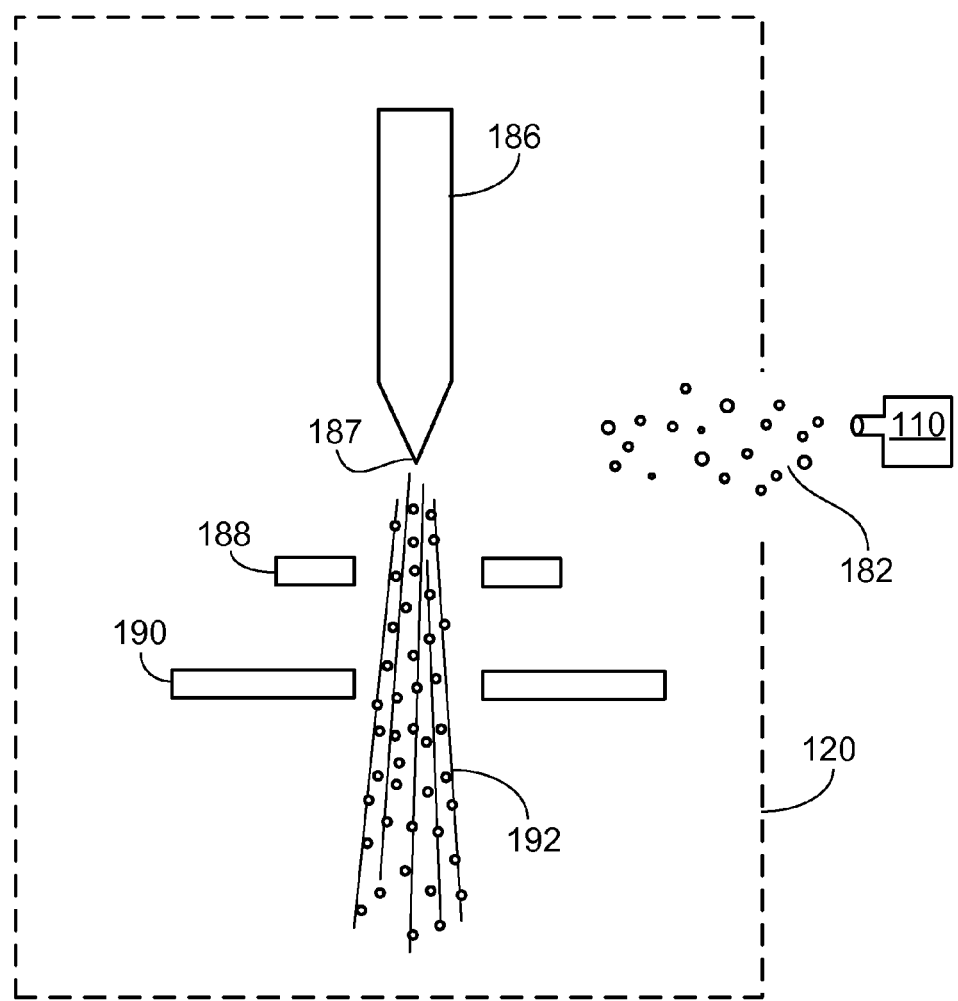
FIG. 2 is a schematic diagram of a gas field ion source.

As shown in FIG. 2, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192.

Optionally, gas source 110 can supply one or more gases in addition to the noble gas(es); an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes an electrically conductive tip 186 with a tip apex 187, an extractor 190 and optionally a suppressor 188.

Electrically conductive tip 186 can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, electrically conductive tip 186 can be formed of an alloy. In some embodiments, electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. Because tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between ion beam 192 and sample 180. As shown in FIG. 2, detector 150 is positioned to detect particles 194 that originate primarily from surface 181 of sample 180, and detector 160 is positioned to detect particles 194 that emerge primarily from surface 183 of sample 180 (e.g., transmitted particles). In general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used. Exemplary detectors include Everhart-Thornley detectors (e.g., to detect secondary electrons), photon detectors, microchannel plate detectors (e.g., to detect condary electrons, neutral atoms and/or ions), conversion plates (e.g., to detect ions), channeltron detectors (e.g., to detect secondary electrons, ions and/or neutral atoms), phosphor detectors (e.g., to detect photons), solid state detectors (e.g., to detect secondary electrons, ions, and/or neutral atoms), scintillator detectors (e.g., to detect photons), energy detectors for ions (e.g., electrostatic prism detectors, magnetic prism detectors, quadrupole detectors), energy detectors for secondary electrons (e.g., electrostatic prism detectors, magnetic prism detectors, detectors with a negatively biased particle selector disposed in the flight path of the electrons to be detected), time-of-flight detectors (e.g., to detect ions)

In general, the information measured by the detectors is used to determine information about sample 180. In some embodiments, such as when the detected particles are secondary electrons, the detected particles are used to form an image of sample 180. In certain embodiments, such as when the detected particles are Auger electrons, secondary ions, secondary neutral particles, primary neutral particles, scattered ions and/or photons, the detected particles are used to determine chemical information about sample 180.

By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, chemical information, crystalline information, voltage contrast information, optical property information, magnetic information), which can optionally be in the form of an image, a graph, a table, a spreadsheet, or the like. Typically, electronic control system 170 includes a user interface that features a display or other kind of output device, an input device, and a storage medium.

In some embodiments, electronic control system 170 can be configured to control additional devices. For example, electronic control system 170 can be configured to regulate a supply (e.g., control flow rate and/or gas composition) of a reactive gas delivered to sample 180 in the vicinity of ion beam 192. The reactive gas can be used, for example, in one or more beam-induced chemical etching operations to selectively remove substrate material. Additionally or alternatively, a reactive gas can be used to deposit conductive material.

Detectors 150 and 160 are depicted schematically in FIG. 2, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and microscope system 200 can typically include any desired number of detectors. The configuration of the various detector(s) can be selected in accordance with particles to be measured and the measurement conditions. In some embodiments, a spectrally resolved detector can be used. Such detectors are capable of detecting particles of different energy and/or wavelength, and resolving the particles based on the energy and/or wavelength of each detected particle.

Figure 3:
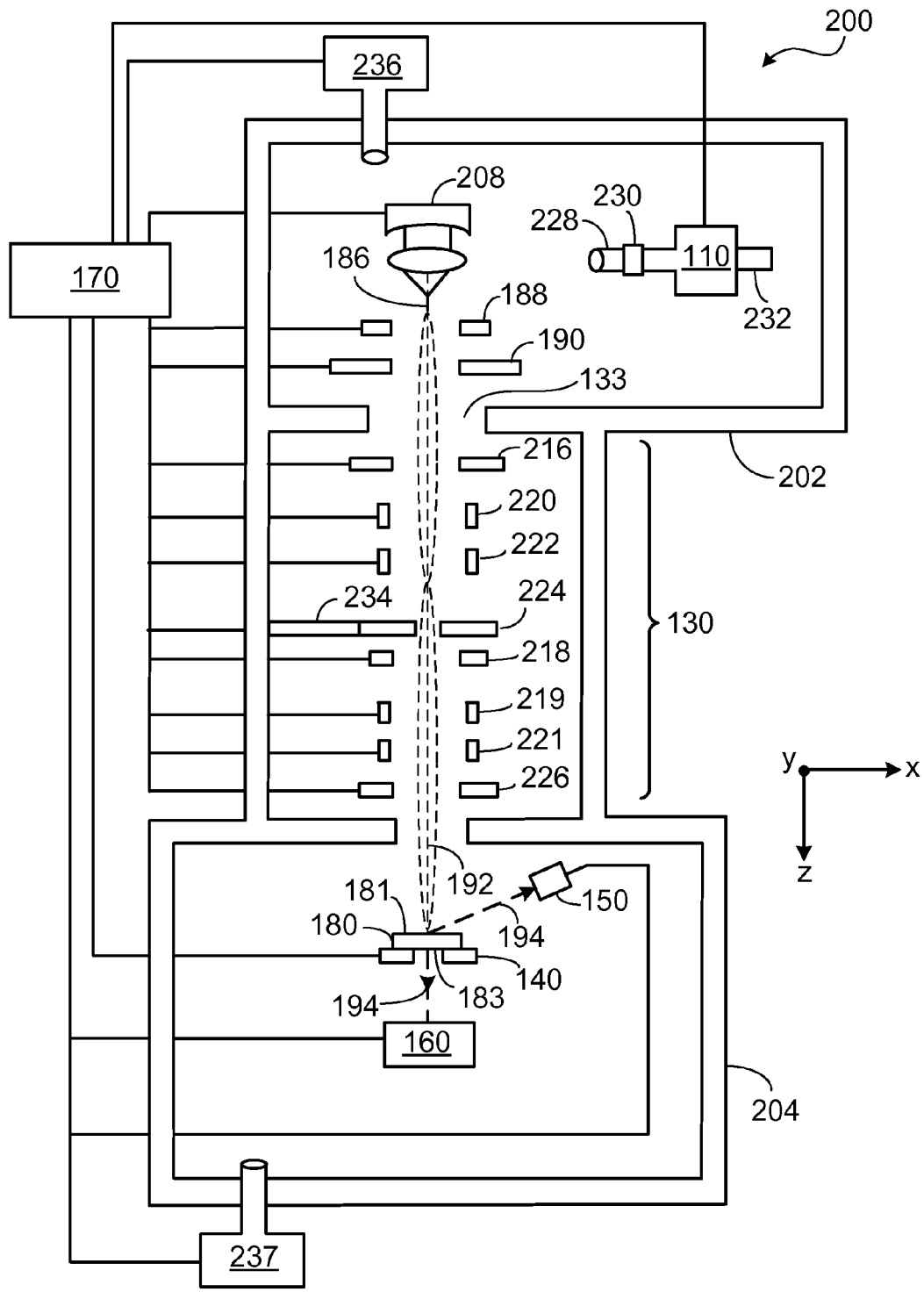
FIG. 3 is a schematic diagram of a gas field ion microscope system.

FIG. 3 shows a schematic diagram of a He ion microscope system 200. Microscope system 200 includes a first vacuum housing 202 enclosing a He ion source and ion optics 130, and a second vacuum housing 204 enclosing sample 180 and detectors 150 and 160. Gas source 110 delivers He gas to microscope system 200 through a delivery tube 228. A flow regulator 230 controls the flow rate of He gas through delivery tube 228, and a temperature controller 232 controls the temperature of He gas in gas source 110. The He ion source includes a tip 186 affixed to a tip manipulator 208. The He ion source also includes an extractor 190 and a suppressor 188 that are configured to direct He ions from tip 186 into ion optics 130. Ion optics 130 include a first lens 216, alignment deflectors 220 and 222, an aperture 224, an astigmatism corrector 218, scanning deflectors 219 and 221, and a second lens 226. Aperture 224 is positioned in an aperture mount 234. Sample 180 is mounted in/on a sample manipulator 140 within second vacuum housing 204. Detectors 150 and 160, also positioned within second vacuum housing 204, are configured to detect particles 194 from sample 180. Gas source 110, tip manipulator 208, extractor 190, suppressor 188, first lens 216, alignment deflectors 220 and 222, aperture mount 234, astigmatism corrector 218, scanning deflectors 219 and 221, sample manipulator 140, and/or detectors 150 and/or 160 are typically controlled by electronic control system 170. Optionally, electronic control system 170 also controls vacuum pumps 236 and 237, which are configured to provide reduced-pressure environments inside vacuum housings 202 and 204, and within ion optics 130.

Figure 4:
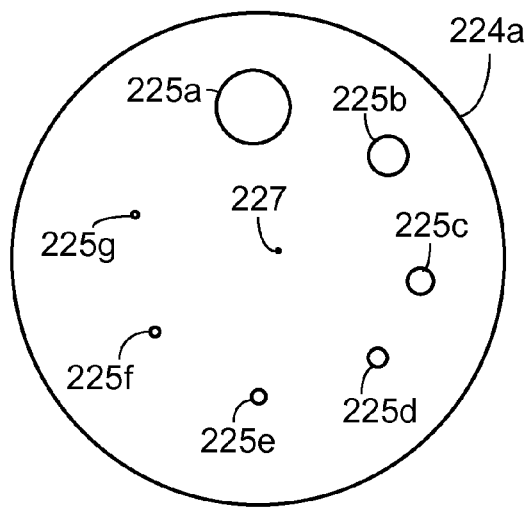
FIG. 4 is a top view of an embodiment of a multi-opening aperture.
Figure 5:
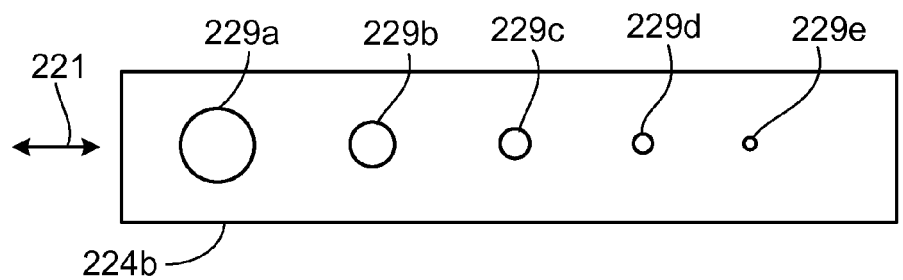
FIG. 5 is a top view of an embodiment of a multi-opening aperture.

As noted above, in general, tip 186 can be formed of any appropriate electrically conductive material. In certain embodiments, tip 186 can be formed of a single crystal material, such as a single crystal metal. Typically, a particular single crystal orientation of the terminal shelf of atoms of tip apex 187 is aligned with a longitudinal axis of tip 186 to within 3° or less (e.g., within 2° or less, within 1° or less). In some embodiments, apex 187 of tip 186 can terminate in an atomic shelf having a certain number of atoms (e.g., 20 atoms or less, 15 atoms or less, 10 atoms or less, nine atoms or less, six atoms or less, three atoms or less). For example, apex 187 of tip 186 can be formed of W(111) and can have a terminal shelf with three atoms (a trimer). FIGS. 4 and 5 show schematic representations of enlarged top and side views, respectively, of the two atomic shelves of a W tip 186 that are nearest to the apex of tip. The terminal shelf, which includes three W atoms 302 arranged in a trimer, corresponds to a (111) surface of W. Without wishing to be bound by theory, it is believed that this trimer surface is advantageous (in terms of its ease of formation, re-formation and stability) because the surface energy of the W(111) crystal face favorably supports a terminal shelf formed by three W atoms arranged in an equilateral triangle to form a trimer. The trimer atoms 302 are supported by a second shelf of W atoms 304.

In some embodiments, tip 186 can have a terminal shelf that includes fewer than three atoms or more than three atoms. For example, a W(111) tip can have a terminal shelf that includes two atoms, or a terminal shelf that includes only one atom. Alternatively, a W(111) tip can have a terminal shelf that includes four or more atoms (e.g., five or more atoms, six or more atoms, seven or more atoms, eight or more atoms, nine or more atoms, ten or more atoms, more than ten atoms).

Alternatively, or in addition, tips that correspond to other W crystalline orientations (e.g., W(112), W(110) or W(100)) can be used, and such tips can have terminal shelves that include one or more atoms (e.g., two or more atoms, three or more atoms, four or more atoms, five or more atoms, six or more atoms, seven or more atoms, eight or more atoms, nine or more atoms, ten or more atoms, more than ten atoms).

In some embodiments, tips formed from a material other than single crystal W can be used in the ion source (e.g., a single crystal of a metal, such as a single crystal of one of the metals noted above), and such tips can have terminal shelves that include one or more atoms (e.g., two or more atoms, three or more atoms, four or more atoms, five or more atoms, six or more atoms, seven or more atoms, eight or more atoms, nine or more atoms, ten or more atoms, more than ten atoms).

Multi-Mode Systems

A gas field ion microscope system can designed to operate in at least two different modes. In a first mode, for example, the ion beam has a relatively low ion current and/or relatively small spot size at the surface of the sample. In a second mode, for example, the ion beam has a relatively high ion current and/or a relatively large spot size at the surface of the sample.

In general, the ion beam current at the surface of the sample in the second mode is greater than the ion beam current at the sample in the first mode. In some embodiments, the ion beam current at the surface of the sample in the second mode is at least two times (e.g., at least three times, at least five times, at least 10 times, at least 25 times, at least 50 times, at least 100 times, at least 500 times, at least 1,000 times) the ion beam current at the surface of the sample in the first mode, and/or the ion beam current at the surface of the sample in the second mode is at most about 5,000 times the ion beam current at the surface of the sample in the first mode. As an example, if the first mode is a relatively high resolution mode, then the ion beam. In certain embodiments, in the first mode the ion current at the surface of the sample is 250 picoAmps or less (e.g., 100 picoAmps or less, 50 picoAmps or less, 25 picoAmps or less, 10 picoAmps or less, five picoAmps or less, one picoAmp or less), and/or in the second mode the ion current at the surface of the sample is 10 picoAmps or more (e.g., 25 picoAmps or more, 50 picoAmps or more, 100 picoAmps or more, 500 picoAmps or more).

In some embodiments, in the first mode the maximum dimension of the ion beam at the surface of the sample is 25 nanometers or less (e.g., 15 nanometers or less, 10 nanometers or less, five nanometers or less), and/or at lest one nanometer. In certain embodiments, in the second mode the maximum dimension of the ion beam spot at the surface of the sample is 10 nanometers or more (e.g., 25 nanometers or more, 50 nanometers or more, 100 nanometers or more), and/or at most 500 naometers.

In general, a gas field ion microscope system is switched between the first mode of operation and the second mode of operation by manipulating the system such that most of the ions in the ion beam that interact with the sample are generated by only one atom of the tip (first mode) or from a plurality of atoms of the tip (second mode). For example, in some embodiments, in the first mode at least 80% (e.g., at least 90%, at least 95%, at least 98%) of the ions in the ion beam that interact with the surface are generated by only one atom of the tip of the ion source (e.g., only one atom of a trimer that forms the terminal shelf of the tip), and/or in the second mode at least 80% (e.g., at least 90%, at least 95%, at least 98%) of the ions in the ion beam that interact with the surface are generated by more than one atom of the tip of the ion source (e.g., two atoms of a trimer that forms the terminal shelf of the tip, three atoms of a trimer that forms the terminal shelf of the tip).

In some embodiments, the gas field ion microscope system can be switched between the first mode and the second mode by changing one or more apertures along the ion beam path between the tip of the ion source and the sample. Generally, in the first mode, the aperture(s) is(are) smaller than in the second mode. For example, referring again to FIG. 3, aperture 224 can be changed from having a relatively small opening in the first mode to having a relatively large opening in the second mode. In some embodiments, aperture 224 can include a plurality of openings having different widths w. For example, FIG. 4 is a top view (along the z-direction of FIG. 3) of a disk-shaped aperture 224a that includes multiple openings 225a-225g. Aperture 224a is configured to rotate about a pivot point 227 that coincides with the center of aperture 224a. The centers of each of openings 225a-225g are positioned at the same distance from pivot point 227. An aperture opening of a particular size can therefore be selected by rotating aperture disk 224a such that a selected opening is positioned in the path of the ion beam, and then translating aperture disk 224a, if desired, to ensure correct alignment of the opening with the ion beam. FIG. 5 is a top view (along the z-direction of FIG. 3) of a rod-shaped aperture 224b that includes multiple openings 229a-229e extending through aperture 224b. The aperture size can be chosen by selecting an opening in aperture 224b. This selection is performed by translating aperture 224b in a direction parallel to arrow 221 to align one of the openings 229a-229e with the ion beam. Typically, openings 225a-225g and 229a-229e have diameters that can be chosen as desired. For example, in some embodiments, the diameter of any of the openings can be five μm or more (e.g., 10 μm or more, 25 μm or more, 50 μm or more) and/or 200 μm or less (e.g., 150 μm or less, 100 μm or less). In certain embodiments, the diameters of openings 225a-225g and/or 229a-229e can be from five μm to 200 μm (e.g., five μm to 150 μm, five μm to 100 μm).

In certain embodiments, the gas field ion microscope system can be switched between the first mode and the second mode by manipulating one or more components in the ion optics (e.g., first lens 216 and/or alignment deflectors 220, 222). This can be achieved, for example, by appropriate selection of the electrical potentials applied to first lens 216 and/or deflectors 220, 222, with or without changing the size of aperture 224 (see discussion above). Such selection can result in switching from the first mode to the second mode by, for example, moving the beam crossover toward the aperture plane so that its image size becomes smaller than the size of the aperture.

Optionally, the gas field ion microscope system can be switched between the first and second modes without removing the sample from the gas field ion microscope system (e.g., without moving the sample).

Exemplary Applications of Multi-Mode Systems

In some embodiments, the first mode can be used to image a sample. For example, secondary electrons can be detected to provide information that results in the image of the sample. A relatively low ion beam current (e.g., created by only one atom of the terminal shelf of the tip) can be used when collecting secondary electrons because the yield of secondary electrons is generally relatively high. In addition, the detector used with secondary electrons (e.g., an Everhardt-Thornley detector) can be custom shaped to conform to the ion optics, allowing the detector to be located relatively close to the area of the sample with which the ion beam interacts, which can enhance secondary electron detection. Further, the energy of the secondary electrons is relatively low and is in some instances of relatively little analytical value, thereby allowing the use of a biased electron grid to accelerate and steer the secondary electrons to the detector, which can augment the effective collection solid angle, without substantially interfering in obtaining the desired information. Further, using a relatively low ion beam current (e.g., created by only one atom of the terminal shelf of the tip) can also result in formation of a relatively small ion beam spot size at the surface of the sample, resulting in a relatively high precision image of the sample.

In certain embodiments, the second mode can be used to detect particles that have a relatively low yield and/or for which it is difficult to position the detector to obtain a relatively high yield of the particles. Examples of such particles can include Auger electrons, secondary ions, secondary neutral particles, primary neutral particles, scattered ions and photons (e.g., X-ray photons, IR photons, visible photons, UV photons). In many instances, such particles can be used to determine chemical information about the sample (e.g., qualitative and/or quantitative information regarding the chemical constituents at the sample surface and/or in the subsurface region of the sample). In such embodiments, using a relatively high ion beam current and/or a relatively large ion beam spot size can increase the number of particles generated at the surface, which can decrease the amount of time used to determine the desired information about the sample.

In embodiments such as discussed in the preceding two paragraphs, switching between the first and second modes of operation typically involves not only manipulating the gas field ion microscope system to change the ion current and/or ion beam spot size at the sample, but also involves switching the detector. Optionally, this can be achieved without removing the sample from the gas field ion microscope system (e.g., without moving the sample).

In some embodiments, the second mode of operation (relatively high ion beam current and/or relatively large ion beam spot size) is used to perform chemistry on the sample at a relatively high rate, while the first mode of operation is used to image the sample (see discussion above) and/or to perform chemistry on the sample at a relatively low rate. Examples of types of chemistry that can be performed on a sample (e.g., a semiconductor sample) include, for example, etching the sample and/or depositing material on the sample. Such embodiments may be implemented, for example, when etching a cross-section of a sample for subsequent inspection of the resulting exposed area of interest of the sample. Often, etching the sample to form the cross-section can take substantially more time than inspecting the article, so using a relatively high ion beam current and/or a relatively large ion beam spot size can reduce the time involved in preparing/analyzing the sample. Alternatively or additionally, it may be desirable to first form a relatively rough cut of the sample, followed by a more precise etch of the sample, prior to inspecting the exposed area of interest of the sample. Thus, it can be advantageous to use a relatively high ion beam current and/or a relatively large ion beam spot size during the initial preparation of the cross-section because precision can be sacrificed for speed, and also because the cross-section can subsequently be precisely refined using a relatively low ion beam current and/or relatively small ion beam spot size. In some embodiments, a relatively high ion beam current and/or a relatively large spot size is used to form a cross-section in a sample, followed by taking an image of the sample without using a relatively precise intermediate process to refine the cross-section. In certain embodiments, a relatively ion beam current and/or a relatively large ion beam spot size is used to form a cross-section in a sample, followed by using a relatively low ion beam current and/or a relatively small ion beam spot size to modify the cross-section of the sample (e.g., to provide a more precisely formed cross-section), which can optionally be followed by taking an image of the sample. In these embodiments, switching between the first and second modes of operation may involve not only manipulating the gas field ion microscope system to change the ion current and/or ion beam spot size at the sample, but may also involve using a detector in one mode but not another mode. Optionally, the relatively high ion current and/or relatively large ion beam spot size is operated for at least two times (e.g., at least five times, at least 10 times) as long as the relatively low ion current and/or relatively small ion beam spot size.

In some embodiments when etching a sample, it may be advantageous to use a relatively heavy gas to enhance the etch rate. For example, Ne, Ar, Kr and/or Xe may be used. This may be particularly beneficial, for example, when attempting to form a cross-section in a sample.

When depositing material, in some embodiments it may be beneficial to use a relatively light gas (e.g., He, $^3$He, molecular hydrogen) to reduce ion beam-induced sputtering that may compete and/or interfere with the desired deposition process. In some cases, deposition of a material on a sample involves the interaction of the ion beam with an appropriate gas (e.g., $Cl_2$, $O_2$, $I_2$, $XeF_2$, $F_2$, $CF_4$, $H_2O$, $XeF_2$, $F_2$, $CF_4$, $WF_6$).

In certain embodiments when obtaining chemical information about a sample, it may be advantageous to use a relatively heavy gas (e.g., Ne, Ar, Kr and/or Xe) to enhance sensitivity for higher mass constituents of the sample (e.g., when detecting scattered ions).

In some embodiments, such as when performing secondary ion mass spectrometry as the detection technique, it could be beneficial to use molecular oxygen as the gas because this could result in a higher ionization fraction of sputtered material.

While the first mode has been described as involving a relatively low ion current, the brightness and/or etendue in the first mode can still be relatively high. In certain embodiments of the first mode, the ion beam has a brightness at the surface of the sample of $5 \times 10^8$ A/m$^2$ srV or more (e.g., $1 \times 10^9$ A/cm$^2$ srV or more, $1 \times 10^{10}$ A/cm$^2$ srV or more). As used herein, the reduced brightness is as defined in U.S. Patent Application Publication No. US 2007/0158558. In certain embodiments of the first mode, the ion beam has an etendue at the surface of the sample of $5 \times 10^{-21}$ cm$^2$ sr or less (e.g., $1 \times 10^{-22}$ cm$^2$ sr or less, $1 \times 10^{-23}$ cm$^2$ sr or less, $1 \times 10^{-23}$ cm$^2$ sr or less, $1 \times 10^{-24}$ cm$^2$ sr or less). As used herein, the etendue is as defined in U.S. Patent Application Publication No. US 2007/0158558. In some embodiments of the first mode, the ion beam has a reduce etendue at the surface of the sample of $1 \times 10^{-16}$ cm$^2$ sr or less (e.g., $1 \times 10^{-17}$ cm$^2$ sr or less, $1 \times 10^{-18}$ cm$^2$ sr or less, $1 \times 10^{-19}$ cm$^2$ sr or less). As used herein, the reduced etendue is as defined in U.S. Patent Application Publication No. US 2007/0158558. In some embodiments of the first mode, the ion beam has a reduced brightness at the surface of the sample of $1 \times 10^9$ A/cm$^2$ sr (e.g., $1 \times 10^{10}$ A/cm$^2$ sr or more, $1 \times 10^{11}$ A/cm$^2$ sr or more). As used herein, the brightness is as defined in U.S. Patent Application Publication No. US 2007/0158558.

While embodiments have been described in which samples are in the form of semiconductor articles, in some embodiments, other types of samples can be used. Examples include biological samples (e.g., tissue, nucleic acids, proteins, carbohydrates, lipids and cell membranes), pharmaceutical samples (e.g., a small molecule drug), frozen water (e.g., ice), read/write heads used in magnetic storage devices, and metal and alloy samples. Exemplary samples are disclosed in, for example, U.S. Published Patent Application 2007-0158558.

While embodiments have been described in which first and second modes are used for etching, in some embodiments, one mode is used for etching and another mode is used for deposition. In certain embodiments, the first and second modes are used for deposition. In some embodiments, the rate of chemistry performed using a relatively large ion beam current and/or a relatively large ion beam spot size can be at least two times (e.g., at least five times, at least 10 times) the rate of chemistry performed on the sample using a relatively low ion beam current and/or a relatively small ion beam spot size.

While embodiments have been described in which a gas field ion microscope system is operated in two different modes, in some embodiments, more than two modes (e.g., three modes, four modes, five modes, six modes, seven modes, eight modes, nine modes, 10 modes, etc.) can be used. The different modes may be defined by the ion beam current, the ion beam spot size, the detector used, the particles detected, and/or the chemistry performed on the sample.

While embodiments have been described in which most of the ions in the ion beam that interact with the sample are generated by only one atom of the tip in the first mode and by a plurality of atoms of the tip in the second mode, more generally most of the ions in the ion beam that interact with the sample in the first mode are generated by a number of atoms of the tip that is less than (e.g., by one atom, by two atoms, by three atoms, by four atoms, etc.) the number of atoms in the tip that generate most of the ions in the ion beam that interact with the sample in the second mode.

In general, any of the systems and/or methods described herein can be implemented and/or controlled in computer hardware or software, or a combination of both. The systems and/or methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose. Each such computer program can be stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The methods or portions thereof can also be implemented as a computer-readable storage medium, configured with a computer program, where the storage medium so configured causes a computer to operate in a specific and predefined manner to perform the functions described herein.

In general, various aspects of the foregoing embodiments can be combined as desired.

Other embodiments are covered by the claims.

What is claimed is:

1. A method of operating a gas field ion microscope system comprising a gas field ion source, the gas field ion source comprising a tip including a plurality of atoms, the method comprising:

operating the gas field ion microscope system in a first mode including interacting a first ion beam with a sample, at least about 80% of the ions in the first ion beam being generated by a first number of atoms of the plurality of atoms of the tip; and operating the gas field ion microscope system in a second mode including interacting a second ion beam with the sample, at least about 80% of the ions in the second ion beam being generated by a second number of atoms of the plurality of atoms of the tip, wherein:

the first mode is different from the second mode, and the first number of atoms is different from the second number of atoms, and the sample is not removed from the gas field ion microscope system between the first and second modes of operation.

2. The method of claim 1, wherein the first ion beam has a first ion current at a surface of the sample, the second ion beam has a second ion current at the surface of the sample, and the second ion current is at least two times the first ion current.

3. The method of claim 1, wherein the first mode comprises forming an image of the sample.

4. The method of claim 3, wherein the second mode comprises obtaining chemical information about the sample.

5. The method of claim 1, wherein the second mode comprises obtaining chemical information about the sample.

6. The method of claim 5, wherein the information about the sample comprises information selected from the group consisting of an image of the sample and chemical information about the sample.

7. The method of claim 1, wherein the first mode comprises detecting particles to provide information about the sample, and the second mode comprises performing chemistry on the sample.

8. The method of claim 1, wherein the first mode comprises performing a first type of chemistry on the sample, and the second mode comprises performing a second type of chemistry on the sample, the second type of chemistry being different from the first type of chemistry.

9. The method of claim 8, wherein the first type of chemistry comprises etching the sample, and the second type of chemistry comprises depositing material on the sample.

10. The method of claim 1, wherein the first mode comprises detecting secondary electrons generated by the interaction of the first ion beam with the sample to form an image of the sample, and the second mode comprises detecting ions to determine chemical information about the sample.

11. The method of claim 1, wherein the first number of the plurality of atoms of the tip is one atom.

12. The method of claim 11, wherein the second number of the plurality of atoms of the tip is at least two atoms.

13. The method of claim 11, wherein the second number of the plurality of atoms of the tip is three atoms.

14. The method of claim 1, wherein the tip has a terminal shelf with three atoms.

15. The method of claim 1, wherein the first mode comprises forming an image of the sample, the second mode comprises obtaining chemical information about the sample, the first number of the plurality of atoms of the tip is one atom, and the second number of the plurality of atoms of the tip is at least two atoms.

16. The method of claim 1, wherein the first mode comprises detecting particles to provide information about the sample, the second mode comprises performing chemistry on the sample, the first number of the plurality of atoms of the tip is one atom, and the second number of the plurality of atoms of the tip is at least two atoms.

17. The method of claim 1, wherein the first mode comprises performing a first type of chemistry on the sample, the second mode comprises performing a second type of chemistry on the sample, the second type of chemistry being different from the first type of chemistry, the first number of the plurality of atoms of the tip is one atom, and the second number of the plurality of atoms of the tip is at least two atoms.

18. The method of claim 1, the first mode comprises detecting secondary electrons generated by the interaction of the first ion beam with the sample to form an image of the sample, the second mode comprises detecting ions to determine chemical information about the sample, the first number of the plurality of atoms of the tip is one atom, and the second number of the plurality of atoms of the tip is at least two atoms.

* * * * *

UNITED STATES PATENT AND TRADEMARK OFFICE
CERTIFICATE OF CORRECTION

PATENT NO. : 8,455,840 B2
APPLICATION NO. : 13/276879
DATED : June 4, 2013
INVENTOR(S) : Lawrence Scipioni It is certified that error appears in the above-identified patent and that said Letters Patent is hereby corrected as shown below:

In the Specification:

Col. 5, line 28, delete "condary" and insert -- secondary --.
Col. 6, line 4, delete "ions)" and insert -- ions). --.
Col. 8, line 39, delete "lest" and insert -- least --.
Col. 8, line 44, delete "naometers." and insert -- nanometers. --.
Col. 9, line 55, delete "Everhardt" and insert -- Everhart --.

Signed and Sealed this
Fifteenth Day of October, 2013

Teresa Stanek Rea
*Deputy Director of the United States Patent and Trademark Office*